US006487685B1

(12) United States Patent
Stuart Fiske et al.

(10) Patent No.: US 6,487,685 B1
(45) Date of Patent: Nov. 26, 2002

(54) SYSTEM AND METHOD FOR MINIMIZING ERROR CORRECTION CODE BITS IN VARIABLE SIZED DATA FORMATS

(75) Inventors: James A. Stuart Fiske, Palo Alto, CA (US); David E. McCracken, San Francisco, CA (US)

(73) Assignee: Silicon Graphics, Inc., Mountain View, CA (US)

( * ) Notice: Subject to any disclaimer, the term of this patent is extended or adjusted under 35 U.S.C. 154(b) by 0 days.

(21) Appl. No.: 09/409,607

(22) Filed: Sep. 30, 1999

(51) Int. Cl.[7] .......................... G06F 11/00; H03M 13/00
(52) U.S. Cl. ..................... 714/701; 774/779; 774/785; 365/185.03
(58) Field of Search ................................. 714/701, 753, 714/762, 773, 779, 785; 365/185.03

(56) References Cited

U.S. PATENT DOCUMENTS

| | | | | |
|---|---|---|---|---|
| 5,418,796 A | * | 5/1995 | Price | 714/762 |
| 5,754,566 A | * | 5/1998 | Christopherson et al. | 714/773 |
| 6,209,113 B1 | * | 3/2001 | Roohparvar | 714/773 |

* cited by examiner

Primary Examiner—Emmanuel L. Moise
(74) Attorney, Agent, or Firm—Baker Botts L.L.P.

(57) ABSTRACT

A method for minimizing ECC bits in variable sized data formats is provided that comprises determining the number of ECC bits needed for each of a plurality of data formats and creating a common data representation for using a single implementation of error detection and correction logic for all of the plurality of data formats. The method then chooses an ECC matrix and default values for unused data bits in the common data representation such that any ECC bits beyond the minimum required for that sized data format will have known values thereby allowing smaller data formats to go through the error detection and correction logic using the common data representation. The method then retrieves a data entry having one of the plurality of data formats and formats the data entry into the common data representation. The method then populates unused bits in the common data representation with default values that are chosen to provide known values for any ECC bits that are only needed for larger data formats thereby minimizing the number of ECC bits stored in each of the plurality of data formats. Errors are detected and corrected in the common data representation.

18 Claims, 6 Drawing Sheets

SYSTEM AND METHOD FOR MINIMIZING ERROR CORRECTION CODE BITS IN VARIABLE SIZED DATA FORMATS

TECHNICAL FIELD OF THE INVENTION

This invention relates in general to the field of data error detection and correction and more particularly to an improved system and method for minimizing error correction code bits in variable sized data formats.

BACKGROUND OF THE INVENTION

In digital electronic systems, information is represented in binary format (1's and 0's). One type of digital electronic system is a computer system. When binary information is passed from one point to another in a computer system, errors may occur. For example, a 1 bit may be interpreted as a 0 bit or a 0 bit may be interpreted as a 1 bit. These errors may be caused by media defects, electronic noise, component failures, poor connections, deterioration due to age, and other factors. When a bit is mistakenly interpreted from a bit source such as internal memory or a storage device, a bit error has occurred. Error detection and correction is the process of detecting bit errors and correcting them. Error detection and correction may be done in software or hardware. One type of error detection and correction system uses error correcting codes (ECC) stored with data to verify the integrity of that data as it is transferred within a computer system. An example of an ECC system is a standard single error correcting, double error detecting (SEC-DED) system. The number of ECC bits stored with the data depends upon the number of bits of data. For example, using SEC-DED, twenty-six bits of data requires six ECC bits and fifty-seven bits of data requires seven ECC bits.

Multiprocessor computers include several processors with each processor having an associated memory. In certain multiprocessor architectures, such as cache-coherent non-uniform memory access (ccNUMA) architectures, processors may access and use any memory within the multiprocessor computer. In directory based multiprocessor computers, a memory directory entry shows the state of every cache line in memory. Multiprocessor computers include several processors capable of operating in parallel. Scalable multiprocessor computers may be sized with a variable number of processors to meet a particular need. In order to minimize the amount of storage required to store directory entries in scalable multiprocessor computers, variable sized memory directory formats may be used where the memory directory size depends upon the number of processors in the multiprocessor computer. Since multiple memory directory formats and sizes may be used, a different number of ECC bits may be needed by each memory directory format. Since it is inefficient and wasteful to implement separate ECC logic for each memory directory format, it is desirable to implement an ECC logic scheme where each memory directory format uses the minimum number of bits for ECC error detection and correction while at the same time using the same ECC logic.

SUMMARY OF THE INVENTION

From the foregoing, it may be appreciated that a need has arisen for a system and method for minimizing error correction code bits in variable sized data formats that minimizes the number of ECC bits and uses the same ECC logic for multiple data formats. In accordance with the present invention, a system and method for minimizing error correction code bits in variable sized data formats are provided that substantially eliminate and reduce disadvantages and problems associated with providing error correction code logic for variable sized data formats.

According to an embodiment of the present invention, a method for minimizing ECC bits in variable sized data formats is provided that comprises determining the number of ECC bits needed for each of a plurality of data formats. The method then creates a common data representation for using a single implementation of error detection and correction logic for all of the plurality of data formats. The common data representation is equal in size to the largest data format in the plurality of data formats and, thus, requires the same number of ECC bits as the largest data format. The method then chooses an ECC matrix and default values for unused data bits in the common data representation such that for smaller data formats, any ECC bits beyond the minimum required for that sized data format will have known values thereby allowing smaller data formats to go through the error detection and correction logic using the common data representation. The method then retrieves a data entry from memory where the data entry has one of the plurality of data formats. The method then formats the data entry into the common data representation. The method then populates unused bits in the common data representation with chosen default values. The chosen default values are chosen to provide known values for any ECC bits that are only needed for larger data formats thereby minimizing the number of ECC bits stored in each of the plurality of data formats. The method then generates a syndrome for the common data representation using the ECC matrix. The method then detects errors in the common data representation in response to the syndrome including any number of "1" bits. The method then corrects errors in the common data representation using the syndrome and the ECC matrix. The method then reformats the common data representation into a format of the retrieved data entry.

The present invention provides various technical advantages over conventional systems and methods for minimizing ECC bits in variable sized data formats. For example, one technical advantage is minimizing the number of ECC bits for each of multiple data formats. Another technical advantage is reusing error detection and correction logic as well as ECC bit generation logic for the multiple data formats. Other technical advantages may be readily apparent to one skilled in the art from the following figures, description, and claims.

BRIEF DESCRIPTION OF THE DRAWINGS

For a more complete understanding of the present invention and the advantages thereof, reference is now made to the following description taken in conjunction with the accompanying drawings, in which like reference numbers represent like parts and wherein.

DETAILED DESCRIPTION OF THE INVENTION

In computer systems, a bit is a single unit of data that has two states, either on or off, represented by a 1 or a 0, respectively. In general, eight bits make a byte. Four bytes make a word, and two words make a double word. Thus, a single word consists of 32 bits, and a double word consists of 64 bits. Bits are generally numbered from 0 to the highest bit number ordered from right to left. Thus, a 64-bit double word would be numbered from zero in the right-most bit position to 63 in the left-most bit position. Bits in the low order bit positions exist in the lower numbered bit positions, and high order bits exist in the higher numbered bit positions. For purposes of this disclosure, when a data set with a specified number of bits is moved to a storage area with a larger number of bits, the bits are transferred into the low order bits of the larger storage area. This results in blank, or null, bits in the high order bits of the larger storage area.

Figures 1A, 1B:
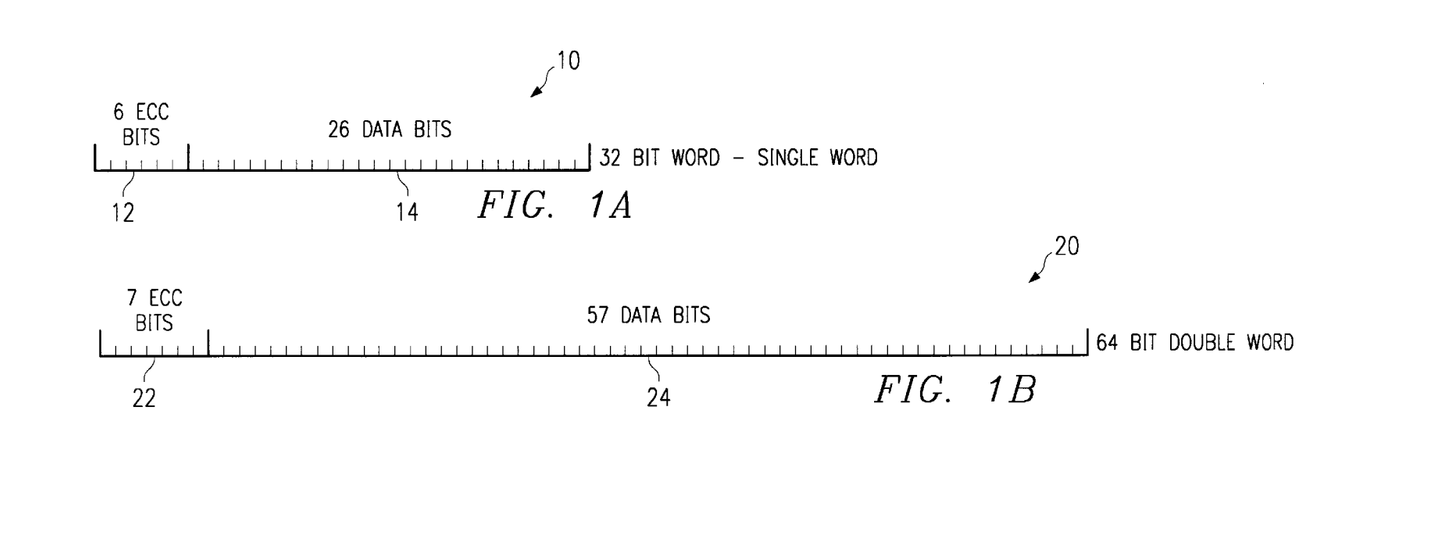
FIGS. 1A and 1B illustrate error correction code (ECC) bits required for a standard directory format and a premium directory format.

Referring to FIGS. 1A and 1B, two memory directory formats for use with a scalable multiprocessor computer are illustrated. A single word directory 10 provides cache line tracking and other memory management functions for a multiprocessor computer with a specified number of processors. In one embodiment, single word directory 10 is a 32-bit word designed for systems up to 128 processors. A double word directory 20 provides cache line tracking and other memory management functions for a multiprocessor computer with a number of processors exceeding the maximum handled by the single word directory 10. In one embodiment, double word directory 20 is a 64-bit double word directory capable of handling up to 1,024 processors. The present invention is scalable to accommodate any number of processors and any sized memory directory format. Although the present invention will be described with relation to variable sized memory directory formats, it is equally applicable to variable sized data formats within any computer system. The application of the present invention to variable sized directory formats is but one embodiment of the present invention. Although the present invention will be described using two memory directory formats, additional memory directory formats may be used for larger numbers of processors. For example, a triple word directory could be used to accommodate processors in excess of 1,024 and up to a maximum number that could be handled by the triple word directory.

In order to verify the integrity of data contained in single word directory 10 and double word directory 20, an error correction code (ECC) system may be used to provide error detection and correction for the directory entries. detecting (SEC-DED) system is used. The SEC-DED system is well documented in the art. Although the remainder of this disclosure will discuss an ECC system using SEC-DED, any suitable error detection and correction system may be used.

For the single word directory 10 of the present invention, six ECC bits 12 are used to provide error detection and correction for the remaining twenty-six data bits 14 in single word directory 10. The double word directory 20 uses seven ECC bits 22 to provide error detection and correction for the remaining fifty-seven data bits 24 of double word directory 20. Thus, the single word directory 10 uses six ECC bits and the double word directory 20 uses seven ECC bits. If additional memory directory formats are used for larger numbers of processors, more ECC bits are generally required for a larger number of data bits.

One alternative for providing error detection and correction logic for multiple directory formats such as single word directory 10 and double word directory 20 is to provide separate error detection and correction logic for each memory directory format. This alternative requires the implementation of two sets of error detection and correction logic thus wasting valuable space and introducing possible timing differences between the multiple sets of logic. Furthermore, as the number of directory formats increases, it is impractical to format separate error detection and correction logic for each directory format.

Another alternative is to provide a single set of error detection and correction logic for the smaller directory format and split the larger directory format into two halves, corresponding in size to the smaller directory format. Each half of the larger directory format would have six ECC bits. Although this alternative requires the implementation of a single set of error detection and correction logic, it requires a total of 12 ECC bits, rather than the minimum of seven, thus wasting memory storage.

Yet another alternative is to provide a single set of error detection and correction logic for the larger directory format and place a number of ECC bits for the larger directory format in the smaller directory format. Thus, single word directory 10 would include seven ECC bits rather than the minimum of six. Although this alternative requires the implementation of a single set of error detection and correction logic, the number of data bits available in the smaller directory format is reduced to accommodate ECC bits for the larger directory format that are not needed in the smaller directory format.

For reasons of efficiency and system design, a single set of error detection and correction logic is desirable to avoid implementing a separate set of error correction and detection logic for each directory format. It is also desirable to minimize the number of ECC bits for each directory format in order to maximize the data portion of each format. Therefore, the error detection and correction logic needs to accommodate multiple directory formats such as single word directory 10 format and double word directory 20 format while minimizing the number of ECC bits in each format.

Figure 2:
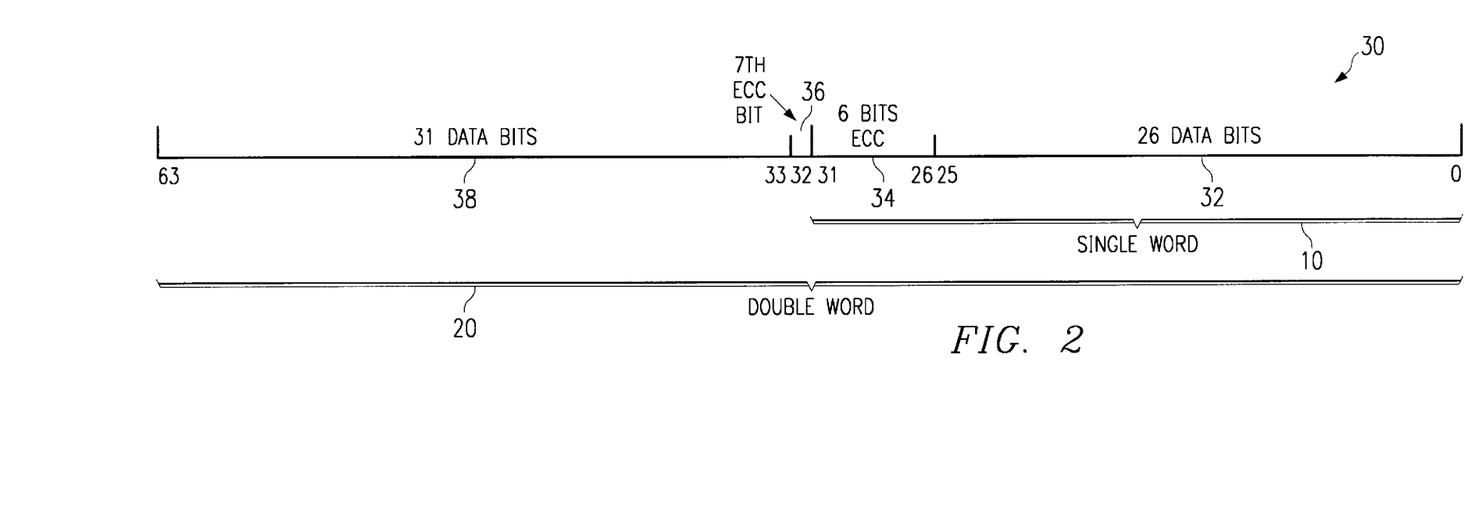
FIG. 2 illustrates a general directory format for minimizing the number of ECC bits for each directory format.

Referring to FIG. 2, a general directory format for minimizing the number of ECC bits for each directory format is generally indicated at 30. General directory format 30 includes twenty-six data bits 32 in the low order bits, and six ECC bits 34 following the twenty-six data bits 32. Together, data bits 32 and ECC bits 34 comprise a single word directory 10 in the low order word of general directory format 30. The high order word of general directory format 30 includes an ECC bit 36 followed by thirty-one data bits 38. Together, data bits 32, ECC bits 34, ECC bit 36 and data bits 38 comprise a double word directory 20.

When the standard error detection and correction logic processes a single word directory 10, it assumes that the high order word of general directory format 30 is filled with a known set of values chosen to produce an expected result after being processed by the error detection and correction logic. By doing this, the error detection and correction logic assumes a known value as the seventh ECC bit 36 and known values in the high order thirty-one data bits 38 thereby resulting in no data errors in the high order word of the general directory format 30. By filling the upper word in general directory format 30 with known values when processing a single word directory 10, a single implementation of error detection and correction logic for the larger directory format may be used while still minimizing the number of ECC bits for each memory directory format.

Figure 3A:
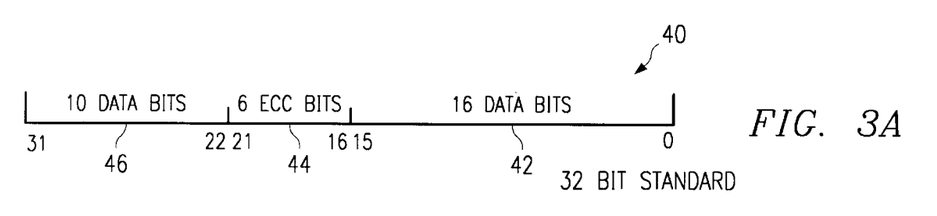
FIGS. 3A and 3B illustrate ECC bit locations within the standard directory format and the premium directory format.

Referring to FIG. 3A, a specific implementation of single word directory 10 is illustrated as standard directory 40. Standard directory 40 includes sixteen low order data bits 42 in bit positions 0 through 15 of standard directory 40. Standard directory 40 also includes six ECC bits 44 following low order data bits 42 in bit positions 16 through 21. Standard directory 40 also includes ten high order data bits 46 following ECC bits 44 in bit positions 22 through 31.

Figure 3B:
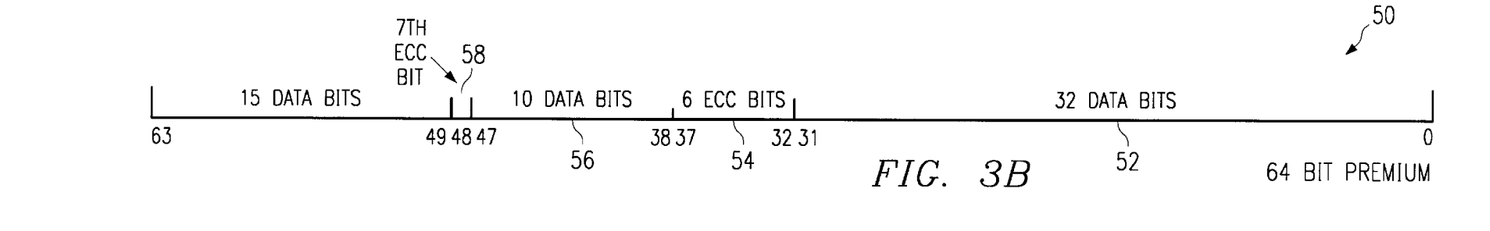

Referring to FIG. 3B, a specific implementation of double word directory 20 is illustrated as premium directory 50. Premium directory 50 includes thirty-two low order data bits 52 in the low order word (bit positions 0 through 31) followed by six ECC bits 54 in bit positions 32 through 37. Premium directory 50 also includes ten middle data bits 56 in bit positions 38 through 47, and an ECC bit 58 in bit position 48, and fifteen high order data bits 60 in bit positions 49 through 63. Other directory formats may be used with the present invention including different arrangement of bits within standard directory 40 and premium directory 50 and additional directory format such as a 128-bit deluxe directory format that would include an appropriate number of ECC bits distributed within the 128-bit deluxe directory format. As additional directory formats are added, the additional ECC bits for the increased size should be generally stored in the added high order bits.

Figure 4A:
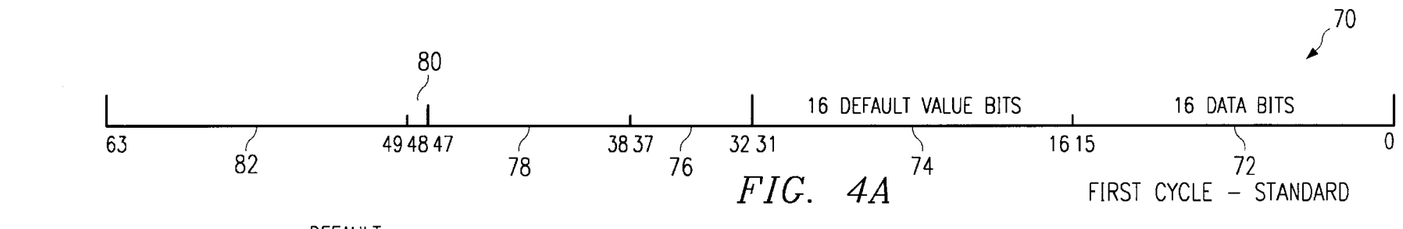
FIGS. 4A and 4B illustrate a translation of the standard directory format into an common directory representation.
Figure 4B:
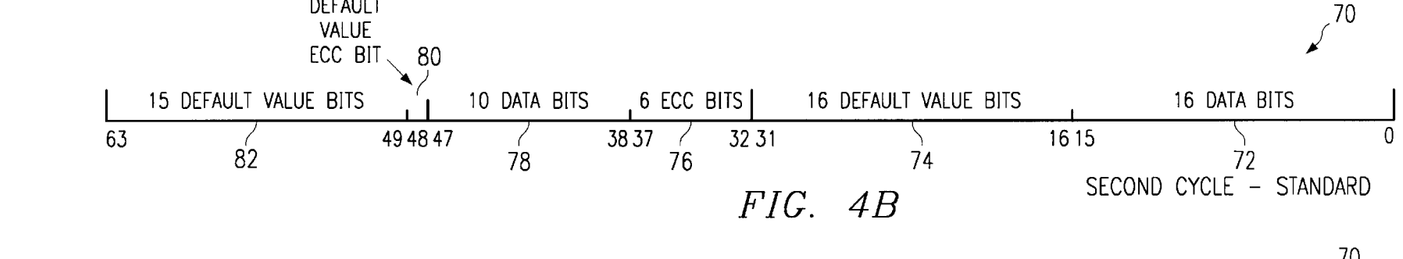

Referring to FIGS. 4A and 4B, a transformation of standard directory 40 format into a common directory representation 70 is illustrated. In order to use a single implementation of error correction and detection logic, the multiple directory formats are transformed into a common directory representation 70. When smaller directory formats are transformed into the larger common directory representation 70, the unused bits in common directory representation 70 are filled with chosen default values such that the extra ECC bits beyond the minimum required for the smaller format have known values. In one embodiment, the transformation takes place over two clock cycles. The first clock cycle is illustrated in FIG. 4A, and the second clock cycle is illustrated in FIG. 4B. The common directory representation 70 has a format identical to premium directory 50. Thus, common directory representation 70 includes first word low order data bits 72, first word high order data bits 74, ECC bits 76, middle data bits 78, ECC bit 80, and high order data bits 82. First word low order data bits 72 and first word high order data bits 74 comprise the first word of common directory representation 70 and correspond to low order data bits 52 of premium directory 50. The second word of common directory representation 70 corresponds to the second word of premium directory 50. Common directory representation 70 is used to provide a common format for processing both standard directory 40 and premium directory 50 through the single implementation of the standard error detection and correction logic. Although the present invention is described with the transformation of standard directory 40 into the common directory representation 70 format over two clock cycles, the transformation may occur on a single clock cycle.

Figures 5A, 5B:
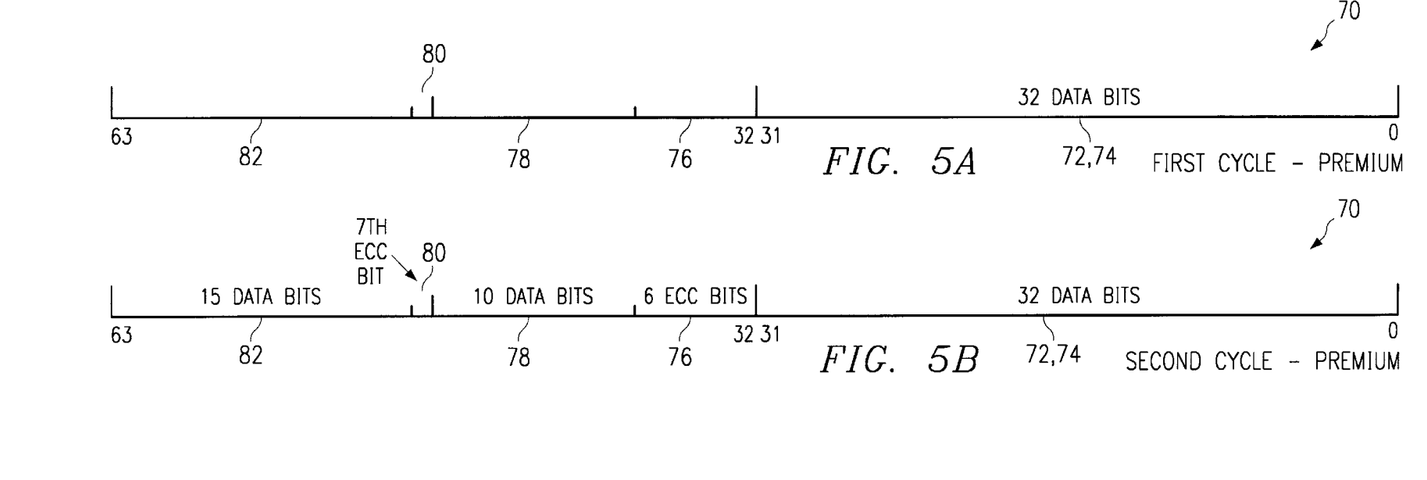
FIGS. 5A and 5B illustrate a transformation of the premium directory format into the common directory representation.

Referring to FIGS. 5A and 5B, a similar transformation of premium directory 50 format into common directory representation 70 is illustrated. FIG. 5A illustrates the transformation on a first clock cycle, and FIG. 5B represents the transformation on a second clock cycle. In another embodiment, the transformation takes place on a single clock cycle.

Figure 6:
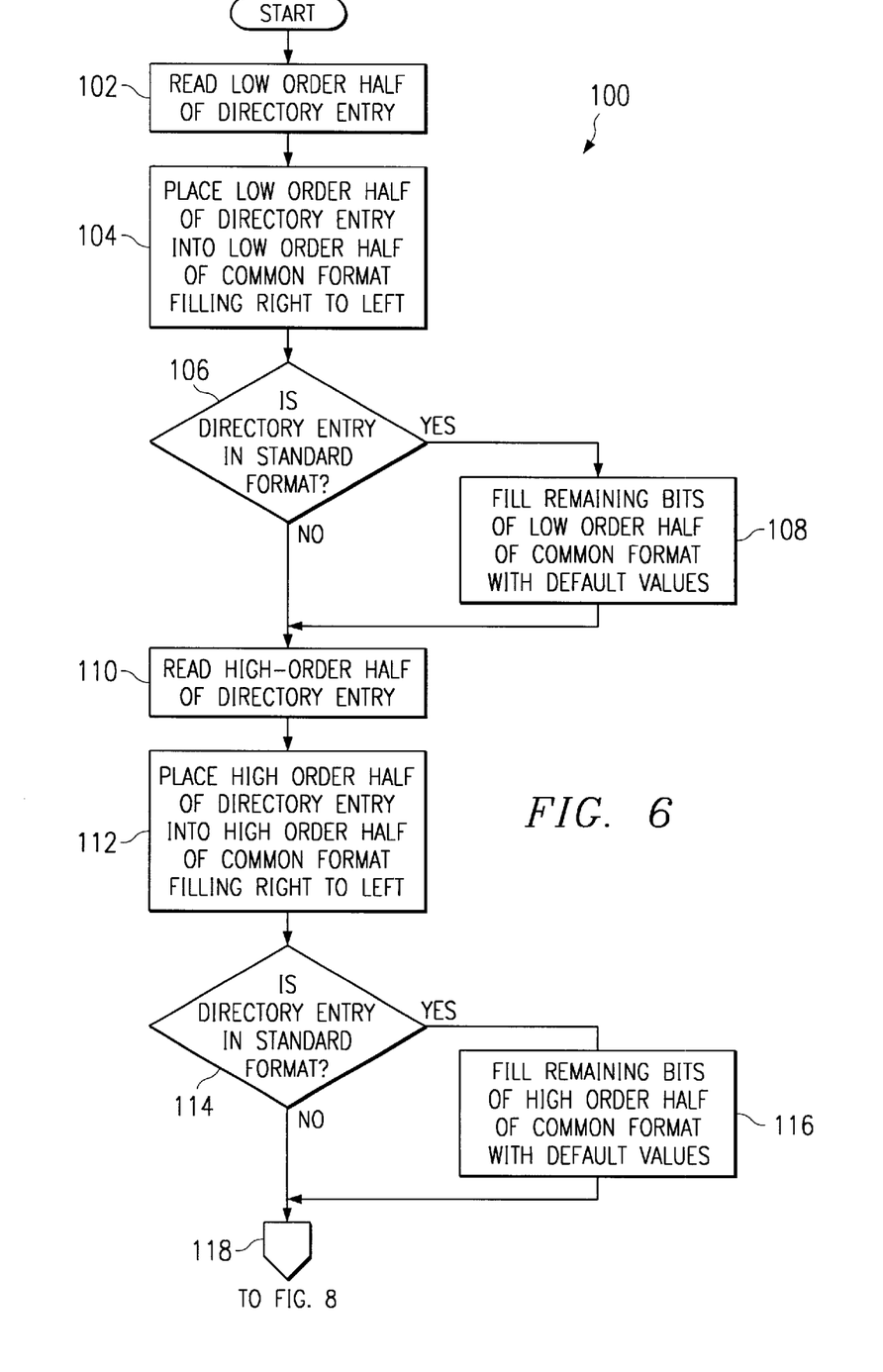
FIG. 6 is a flow diagram illustrating the transformation of the standard directory format and the premium directory format into the common directory representation.

FIGS. 6 is flow diagrams illustrating the transformation of either standard directory 40 or premium directory 50 into common directory representation 70 as illustrated in FIGS. 4A, 4B, 5A and 5B. Referring to FIG. 6, a process of formatting either standard directory 40 or premium directory 50 into common directory representation 70 is generally indicated at 100. The process commences at step 102 where the low order half of a directory entry is obtained on a first clock cycle. The directory entry referred to in step 102 may be either a standard directory 40 or a premium directory 50. The low order half of a standard directory 40 would be the sixteen low order data bits 42, and the low order half of a premium directory 50 would be the thirty-two low order data bits 52. The format of the directory entry is referred to as the original directory format and may be either a standard directory 40 format or a premium directory 50 format.

The process proceeds to step 104 where the low order half of the directory entry is placed into the low order word of common directory representation 70. The bits of the low order half of the directory entry are moved from right to left into the corresponding bits of the low order word of common directory representation 70 until no bits remain. Thus, if the low order half of the directory entry includes only sixteen bits, then only first word low order data bits 72 of common directory representation 70 would be filled. In that case, first word high order data bits 74 would include blank, or null, values.

The process proceeds to decisional step 106 where a decision is made regarding whether the directory entry is a standard directory 40. If the directory entry is a standard directory 40, the YES branch of decisional step 106 proceeds to step 108 where first word high order data bits 74 of common directory representation 70 are filled with chosen default values. If the process proceeds to this step, then only first word low order data bits 72 of common directory representation 70 have been filled with valid data. Thus, the remaining bits of the low order word of common directory representation 70 are initialized with chosen default values. The process proceeds to step 110. In addition, if the directory entry is not a standard directory 40, the NO branch of decisional step 106 proceeds to step 110.

In step 110, the high order half of the directory entry is obtained on a second clock cycle. If the directory entry is a standard directory 40, the high order half of the directory entry would be the six ECC bits 44 and the ten high order data bits 46. If the directory entry is a premium directory 50, the high order half of the directory entry includes the six ECC bits 54, the ten middle data bits 56, the single ECC bit 58, and the fifteen high order data bits 60.

The process proceeds to step 112 where the high order half of the directory entry is placed into the high order word of common directory representation 70 moving data bits from the directory entry from right to left into the corresponding data bit positions in the high order word of common directory representation 70. Since the directory entry can be in either standard format or premium format, the upper half of the high order word of common directory representation 70 may contain invalid, or null, data.

The process proceeds to decisional step 114 where a decision is made regarding whether the directory entry is a standard directory 40. If the directory entry is a standard directory 40, the YES branch of decisional step 114 proceeds to step 116 where the high order half of the high order word of common directory representation 70 is initialized with chosen default values. The high order half of the high order word of common directory representation 70 includes ECC bit 80 and high order data bits 82. If the process proceeds to this step, a standard directory 40 format is being transformed into the larger common directory representation 70 thereby leaving invalid data in the high order half of the high order word of common directory representation 70. The process proceeds to connector 118. If the directory entry is not a standard directory 40, the NO branch of decisional step 114 proceeds to connector 118 where the process proceeds to the flow diagram illustrated in FIG. 8.

After the directory entry is formatted into the common directory representation 70, the common directory representation 70 is ready for processing by a standard SEC-DED error detection and correction system. The ECC bits stored within common directory representation 70 are standard SEC-DED codes. The standard SEC-DED system uses an ECC matrix to generate ECC bits when data is written to memory and to detect errors when data is read from memory by generating an ECC syndrome. An ECC syndrome with all zeros means that there were no bit errors. An ECC syndrome with odd parity (odd number of 1's in the syndrome) means a single bit error, and a syndrome with even parity (even number of 1's) means a double bit error. In order for a single implementation of the error detection and correction logic using the ECC matrix to function properly for all directory formats, the ECC matrix values must be chosen correctly so that implied ECC bits for the smaller directory formats are known values. Implied ECC bits are those ECC bits that are not stored in the smaller directory formats but rather are needed for the single implementation of the standard SEC-DED logic. Since all ECC bits for the common directory representation 70 are not stored in the smaller directory formats, certain ECC bits have implied values for processing through the standard error detection and correction logic when the common directory representation 70 has a smaller directory format entry. In one embodiment, the known values for the implied ECC bits are zero.

Figure 7:
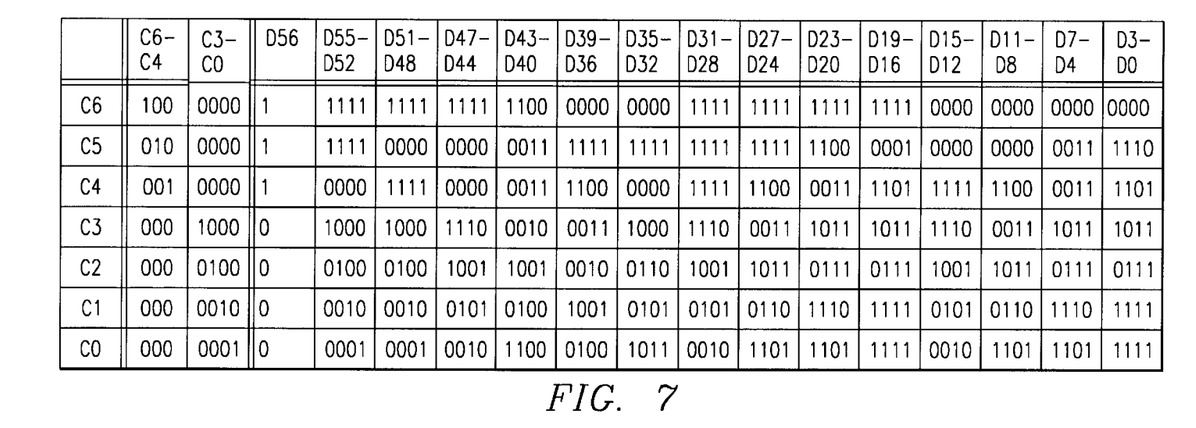
FIG. 7 is an illustrative ECC matrix for use with an single error correcting, double error detecting (SEC-DED) system.

Referring to FIG. 7, a sample ECC matrix for use with SEC-DED logic is generally indicated at 130. The ECC matrix 130 should have a number of rows equal to the number of ECC bits needed for common directory representation 70 and a number of columns equal to the number of data bits plus the number of ECC bits in common directory representation 70. According to a standard SEC-DED error correction and detection system, the ECC matrix 130 should have an odd number of "1" bits in each column. The ECC matrix 130 is used by the SEC-DED logic to generate check bits (ECC bits) to be stored with the data when a directory entry is written to memory.

During ECC bit generation, each ECC bit is generated by bitwise ANDing the data bits in common directory representation 70 with the appropriate ECC matrix 130 row creating a new bit vector equal in length to the data bits in common directory representation 70. The bits in the new bit vector are then XORed together to create the single ECC bit. This is repeated for each row in the ECC matrix 130 to generate an ECC bit corresponding to each row.

In one embodiment, the ECC bits are numbered ECC [0]... ECC [6]. The data bits in common directory representation 70 are labeled DATA [56:0]. The seven rows of ECC matrix 130 are labeled MATRIX0... MATRIX6. To generate the ECC bits:

ECC[0]=XOR together all bits in (DATA[56:0] AND MATRIX0[56:0])

ECC[1]=XOR together all bits in (DATA[56:0] AND MATRIX1[56:0])

ECC[2]=XOR together all bits in (DATA[56:0] AND MATRIX2[56:0])

ECC[3]=XOR together all bits in (DATA[56:0] AND MATRIX3[56:0])

ECC[4]=XOR together all bits in (DATA[56:0] AND MATRIX4[56:0])

ECC[5]=XOR together all bits in (DATA[56:0] AND MATRIX5[56:0])

ECC[6]=XOR together all bits in (DATA[56:0] AND MATRIX6[56:0])

This process is done for each of the ECC bits using the corresponding row in ECC matrix 130. Each row of the ECC matrix 130 determines the bits that feed an XOR tree for a corresponding ECC bit.

The ECC matrix 130 is also used by the SEC-DED logic to detect errors in directory entries read from memory. When a directory entry is read from memory, the data portions of the directory entry and the ECC bits for that directory entry are returned. The SEC-DED logic then uses the ECC matrix 130 to generate a syndrome. The syndrome has the same number of bits as there are ECC bits in common directory representation 70. Each bit in the syndrome is generated by bitwise ANDing the combination of the ECC bits and the data bits with the corresponding row of the ECC matrix 130, and then XORing all of the resulting bits together. In one embodiment where common directory representation 70 includes 57 data bits and 7 ECC bits, the syndrome is generated by:

Syndrome[0]=XOR together all bits in ((ECC[6:0],DATA [56:0]) AND MATRIX0[63:0])

Syndrome[1]=XOR together all bits in ((ECC[6:0],DATA [56:0]) AND MATRIX1[63:0])

Syndrome[2]=XOR together all bits in ((ECC[6:0],DATA [56:0]) AND MATRIX2[63:0])

Syndrome[3]=XOR together all bits in ((ECC[6:0],DATA [56:0]) AND MATRIX3[63:0])

Syndrome[4]=XOR together all bits in ((ECC[6:0],DATA [56:0]) AND MATRIX4[63:0])

Syndrome[5]=XOR together all bits in ((ECC[6:0],DATA [56:0]) AND MATRIX5[63:0])

Syndrome[6]=XOR together all bits in ((ECC[6:0],DATA [56:0]) ANDMATRIX6[63:0])

The above process is performed using each ECC matrix 130 row to generate a different syndrome bit. If the syndrome is all 0s, then there is no error. If the syndrome has an odd number of 1s, then there is a single bit error, and if the syndrome has an even number of is then the syndrome has a double bit error.

The ECC matrix 130 is also used by the SEC-DED logic to correct detected single bit errors. The standard SEC-DED logic will generate an unrecoverable read error if a double bit error occurs. However, single bit errors can be corrected. This is done by XNORing each syndrome bit with the corresponding row of the ECC matrix 130 and bitwise ANDing all the resulting bits together. That result is then XORed with the data in common directory representation 70 to get the corrected data. In one embodiment where common directory representation 70 includes 57 data bits and 7 ECC bits, the error correction phase may be illustrated as:

DecodeSyndrome[56:0]=(57{Syndrome[0]} XNOR MATRIX0[56:0]) AND
(57{Syndrome[1]} XNOR MATRIX1[56:0]) AND
(57{Syndrome[2]} XNOR MATRIX2[56:0]) AND
(57{Syndrome[3]} XNOR MATRIX3[56:0]) AND
(57{Syndrome[4]} XNOR MATRIX4[56:0]) AND
(57{Syndrome[5]} XNOR MATRIX5[56:0]) AND
(57{Syndrome[6]} XNOR MATRIX6[56:0])
CorrectData[56:0]=DecodeSyndrome[56:0] XOR DATA [56:0].

The term "57{Syndrome[0]}" means that Syndrome[0] is replicated 57 times. The above summary of the SEC-DED error correction and detection system is well documented in the art.

In standard directory 40 format, the unused bits and common directory representation 70 are set to chosen default values, and the matrix is arranged so that the seventh implied ECC bit is generated as an expected value. In one embodiment, the unused bits are set to zero so that the seventh implied ECC bit is also zero. However, any set of default values may be chosen in order to generate a chosen seventh implied ECC bit. In the ECC matrix 130, the unused bits correspond to fields <63:49>, <31:16>, and the most significant (seventh) ECC bit.

Within the bounds of the requirement that the columns of the ECC matrix 130 must have an odd number of bits set to "1", the ECC matrix 130 and the filler bits inserted in common directory representation 70 are chosen in such a way that the implied ECC bits for the smaller directory formats are known values. These filler bits are the chosen default values when a smaller sized directory is formatted into common directory representation 70. Specifically, in the present invention, the seventh implied ECC bit is equal to an XOR together of all bits in DATA [56:0] and MATRIX6 [56:0] where DATA refers to the 57 data bits in common directory representation 70 and MATRIX6 refers to the sixth row of ECC matrix 130. For a standard directory 40 format, the 26 bits of data are in bit positions DATA [41:32] and DATA [15:0], and the filler bits (chosen default values) are in positions DATA [56:42] and DATA [31:16]. If the filler bits are chosen to be all zeros and the MATRIX6 [41:32] and MATRIX6 [15:0] are all zeros, then the seventh implied ECC bit is guaranteed to be zero. Therefore, the seventh implied ECC bit does not need to be stored as part of the standard directory 40 format, and it is an implied value of zero. In another embodiment, the ECC matrix 130 is chosen such that the seventh implied ECC bit for a directory entry in standard directory 40 format is generated to be a known value of "1". The ECC matrix 130 may be expanded to accommodate larger directory formats. In that case, the ECC matrix 130 is chosen such that directory formats smaller than the common directory representation 70 generate known values for ECC bits that are only necessary for larger directory formats. By doing this, a minimum number of ECC bits are used for each memory directory format.

Figure 8:
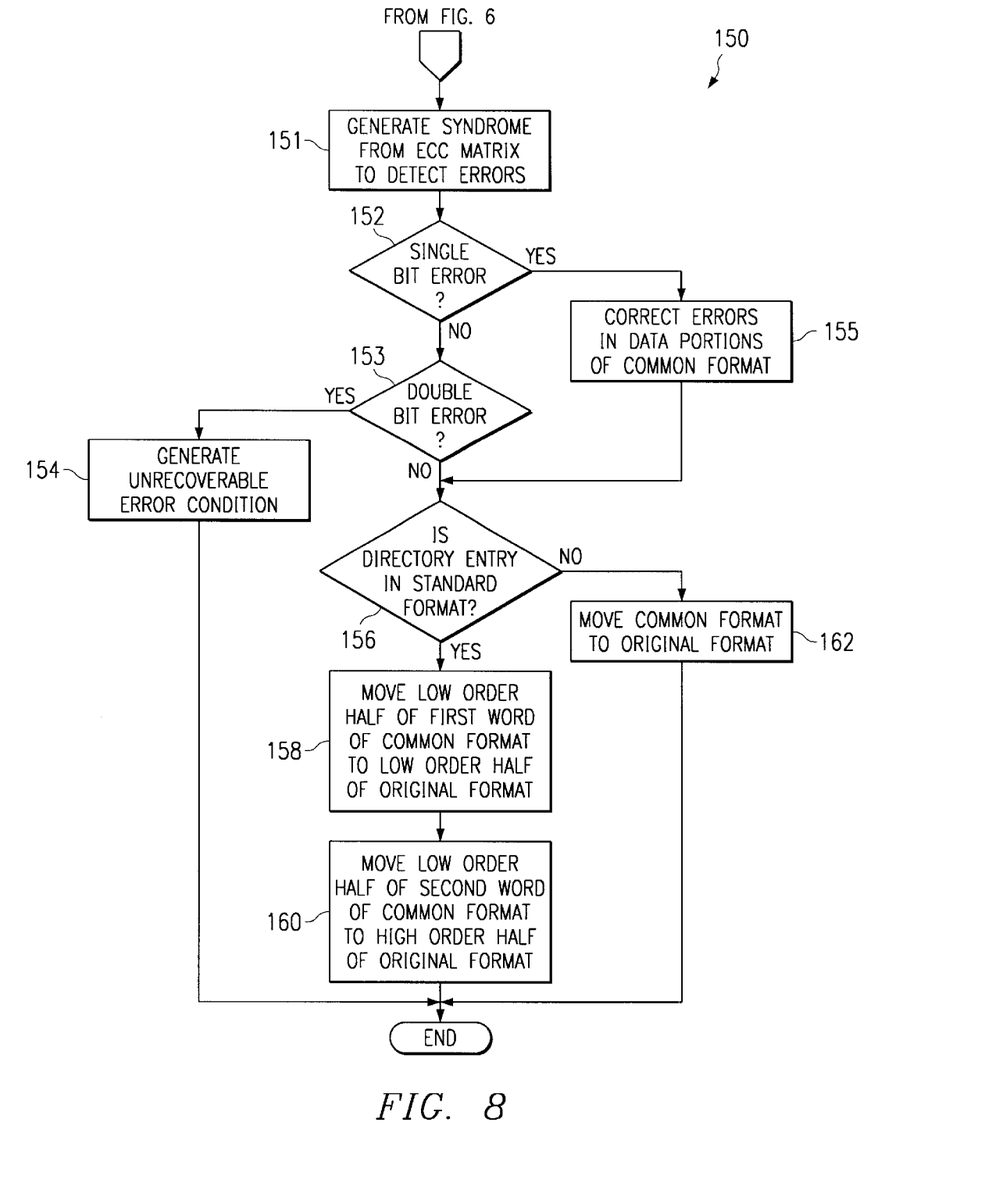
FIG. 8 is a flow diagram illustrating error detection and correction of the common directory representation and translation of the common directory representation back into an original directory format.

Referring to FIG. 8, a process for standard error detecting and correcting and reformatting of common directory representation 70 into the original directory entry format is generally indicated at 150. The process commences at step 151 where the standard error detection and correction logic generates a syndrome from the ECC matrix 130.

The process proceeds to decisional step 152 where a decision is made regarding whether the syndrome indicates a single bit error. If the syndrome does not indicate that a single bit error has occurred, the NO branch of decisional step 152 proceeds to decisional step 153 where a decision is made regarding whether the syndrome indicates a double bit error. If the syndrome indicates a double bit error, the YES branch of decisional step 153 proceeds to step 154 where an unrecoverable error condition is generated. After step 154, the method terminates.

Returning to decisional step 152, if the syndrome indicates that a single bit error has occurred, the YES branch of decisional step 152 proceeds to step 155 where detected errors are corrected in common directory representation 70 using standard error detection and correction logic. At the end of this step, common directory representation 70 contains valid data for processing by the multiprocessor computer system. After step 155, the process proceeds to decisional step 156.

Returning to decisional step 153, if the syndrome indicates that a double bit error has not occurred, the NO branch of decisional step 153 proceeds to decisional step 156 where a decision is made regarding whether the directory entry is a standard directory 40. If the directory entry is a standard directory 40, the YES branch of decisional step 156 proceeds to step 158 where the first word low order data bits 72 is moved to low order data bits 42 of standard directory 40. If the process proceeds to this step, the larger format common directory representation 70 needs to be transformed into the smaller format standard directory 40 prior to processing by the multiprocessor computer system.

The method proceeds to step 160 where ECC bits 76 of common directory representation 70 are moved to ECC bits 44 of standard directory 40, and middle data bits 78 of common directory representation 70 are moved to high order data bits 46 of standard directory 40. At the end of this step, standard directory 40 contains a verified and integrity-checked directory entry ready for processing and use the by multiprocessor computer system. After step 160, the process terminates.

If the directory entry is not a standard directory 40, the NO branch of decisional step 156 proceeds to step 162 where common directory representation 70 is moved to premium directory 50. Since common directory representation 70 shares a common format with premium directory 50, no transformation of data is necessary for a premium formatted directory entry. At the end of this step, premium directory 50 contains verified and integrity-checked data ready for processing and use by the multiprocessor computer system. After step 162, the process terminates.

Figure 9:
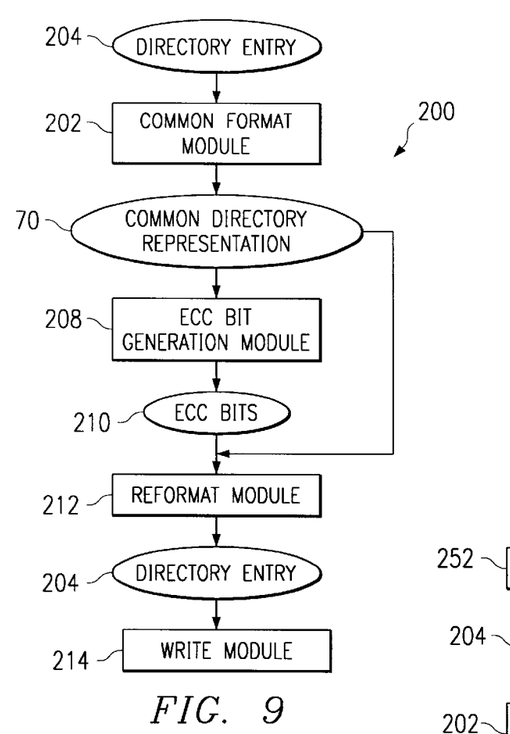
FIG. 9 is a block diagram illustrating a system for generating the minimum number of ECC bits for each directory format.

Referring to FIG. 9, a system for generating a minimum number of ECC bits in variable size directory formats that implements the process disclosed with relation to FIGS. 1 through 8 is generally indicated at 200. A common format module 202 receives a directory entry 204 for writing to directory memory and transforms that directory entry 204 into a common directory representation 70. Directory entry 204 may be either a standard directory 40 or a premium directory 50. Common format module 202 implements steps 102 through 116 illustrated in FIG. 6.

An ECC bit generation module 208 receives common directory representation 70 and generates a set of ECC bits 210 for the data portions of the common directory representation 70. ECC bit generation module 208 uses standard SEC-DED ECC bit generation logic with ECC matrix 130.

A reformat module 212 receives common directory representation 70 and ECC bits 210 and transforms them into directory entry 204 which is the original format of the directory entry entering the SEC-DED ECC bit generation logic. Reformat module 212 transforms the common directory representation 70 into either a standard directory 40 or a premium directory 50 dependent upon the original format of the directory entry 204.

A write module 214 receives reformatted directory entry 204 and writes reformatted directory entry 204 to directory memory.

Figure 10:
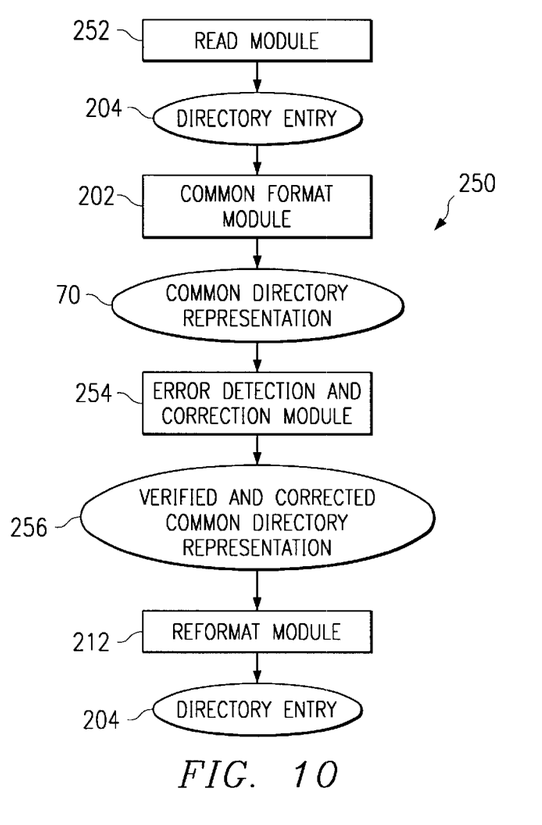
FIG. 10 is a block diagram illustrating a system for error detection and correction while minimizing ECC bits in variable sized directory formats.

Referring to FIG. 10, a system for error correction and detection for variable size directory formats that implements the process disclosed with relation to FIGS. 1 through 8 is generally indicated at 250. A read module 252 receives an instruction to read a directory entry 204 from directory memory. Directory entry 204 may be either a standard directory 40 or a premium directory 50.

The common format module 202 receives a directory entry 204 from read module 252 and transforms that directory entry 204 into a common directory representation 70. Common format module 202 implements steps 102 through 116 illustrated in FIG. 6.

An error detection and correction module 254 receives common directory representation 70 detects any errors within common directory representation 70. Error detection and correction module 254 uses the ECC bits stored in common directory representation 70 and the ECC matrix 130 to detect errors using standard SEC-DED error detection logic. If errors are present, error detection and correction module 254 uses standard SEC-DED error detection logic to correct those errors. Error detection and correction module 254 creates a verified and corrected common directory representation 256. Error detection and correction module 254 implements step 155 illustrated in FIG. 8.

Reformat module 212 receives verified and corrected common directory representation 256 and transforms it into directory entry 204 which is the original format of the directory entry 204 entering the error detection and correction logic. Reformat module 212 transforms the verified and corrected common directory representation 256 into either a standard directory 40 or a premium directory 50 dependent upon the original format of the directory entry 204.

Thus, it is apparent that there has been provided, in accordance with the present invention, a system and method for minimizing error correction code bits in variable sized data formats that satisfies the advantages set forth above. Although the present invention and its advantages have been described in detail, it should be understood that various changes, substitutions, and alterations may be readily ascertainable by those skilled in the art and may be made herein without departing from the spirit and the scope of the present invention as defined by the following claims.

What is claimed is:

1. A method for minimizing ECC bits in variable sized data formats, comprising:
   determining a number of ECC bits needed for each of a plurality of data formats;
   creating a common data representation equal in size to a largest data format in the plurality of data formats, the common data representation for using a single implementation of error detection and correction logic for all of the plurality of data formats;
   choosing an ECC matrix and default values for unused data bits such that for smaller data formats, any ECC bits beyond the minimum required for that sized data format will have known values thereby allowing smaller data formats to go through the error detection and correction logic using the common data representation;
   retrieving a data entry from memory, the data entry having one of the plurality of data formats;
   formatting the data entry into the common data representation;
   populating unused bits in the common data representation with chosen default values, the chosen default values chosen to provide known values for any ECC bits that are only needed for larger data formats thereby minimizing the number of ECC bits stored in each of the plurality of data formats;
   generating a syndrome for the common data representation using the ECC matrix;
   detecting errors in the common data representation in response to the syndrome including any number of "1" bits;
   correcting errors in the common data representation using the syndrome and the ECC matrix;
   reformatting the common data representation into a format of the retrieved data entry.

2. The method of claim 1, further comprising:
   receiving a data entry for writing to memory, the directory entry having one of the plurality of data formats;
   formatting the data entry into the common data representation;
   populating unused bits in the common data representation with chosen default values, the chosen default values chosen to provide known values for any ECC bits that are only needed for larger data formats thereby minimizing the number of ECC bits stored in each of the plurality of data formats;
   generating ECC bits for data portions of the common data representation using the ECC matrix;
   reformatting the data portions of the common directory representation corresponding to data portions of the received data entry and the ECC bits needed for a format of the received data entry into the format of the received data entry thereby minimizing a required number of ECC bits stored with the data entry;
   writing the reformatted data entry to memory.

3. A method for minimizing ECC bits in variable sized directory formats, comprising:
   obtaining a low order half of a directory entry;
   placing the low order half of the directory entry into a low order half of a common directory representation, the low order half of the directory entry being right justified in the low order half of the common directory representation;
   obtaining a high order half of the directory entry;
   placing the high order half of the directory entry into a high order half of the common directory representation, the high order half of the directory entry being right justified in the high order half of the common directory representation, the high order half of the common directory representation including a plurality of stored ECC bits;
   generating a syndrome for the common directory representation using an ECC matrix;
   detecting errors in the common directory representation in response to the syndrome including any number of "1" bits;
   correcting errors in the common directory representation using the syndrome and the ECC Matrix;

reformatting the common directory representation into a format of the directory entry.

4. The method of claim 3, further comprising:

populating any unused high order bits in the low order half of the common directory representation with chosen default values, the chosen default values chosen to provide known values for ECC bits that are only needed for larger formats represented in the common directory representation thereby minimizing the number of ECC bits stored in a given directory entry format;

populating any unused high order bits in the high order half of the common directory representation with chosen default values.

5. The method of claim 3, wherein placing the high order half of the directory entry includes:

placing a first set of one or more ECC bits stored in the high order half of the directory entry in the low order bits of the high order half of the common directory representation;

placing a first set of one or more data bits of the high order half of the directory entry in a next available low order bits of the high order half of the common directory representation.

6. The method of claim 5, further comprising:

placing a second set of one or more ECC bits stored in the high order half of the directory entry in a next available bit position of the high order half of the common directory representation;

placing a second set of one or more data bits of the high order half of the directory entry in a remaining bit positions of the high order half of the common directory representation.

7. The method of claim 5, further comprising:

populating the remaining bit positions of the high order half of the common directory representation with chosen default values, the chosen default values chosen to provide known values for ECC bits that are only needed for larger formats represented in the common directory representation thereby minimizing the number of ECC bits stored in a given directory entry format.

8. The method of claim 3, wherein reformatting the common directory representation into a format of the directory entry includes:

placing the low order half of the common directory representation into the low order half of the directory entry wherein any bits exceeding a size of the low order half of the directory entry are not moved;

placing the high order half of the common directory representation into the high order half of the directory entry wherein any bits of the high order half of the common directory representation exceeding a size of the high order half of the directory entry are not moved.

9. A system for minimizing ECC bits in variable sized directory formats, comprising:

a standard directory operable to track memory management information for a multiprocessor computer system with a specified number of processors, the standard directory including one or more data portions and one or more ECC bits;

a premium directory operable to track memory management information for a multiprocessor computer system with a number of processors exceeding the specified number of processors, the premium directory including one or more data portions and one or more ECC bits;

a common directory representation operable to provide a common format for performing error detection and correction logic on both the standard directory and the premium directory using a single implementation of the error detection and correction logic, the common directory representation including one or more data portions and one or more ECC bits;

a common format module operable to format the standard directory into the common directory representation and to fill unused bits of the common directory representation with chosen default values, the chosen default values chosen to provide known values for ECC bit, that are only needed for larger formats represented in the common directory representation thereby minimizing the number of ECC bits stored in a given directory entry format, the common format module further operable to format the premium directory into the common directory representation;

an error detection and correction module operable to generate a syndrome for the common directory representation using an ECC matrix, the error detection and correction module further operable to detect and correct errors in the common directory representation using the syndrome and the ECC matrix;

a format module operable to format the error detected and corrected common directory representation into an original directory entry format.

10. The system of claim 9, wherein the standard directory is thirty-two bits wide with six ECC bits and twenty-six data bits.

11. The system of claim 9, wherein the premium directory is sixty-four bits wide with seven ECC bits and fifty-seven data bits.

12. The system of claim 11, wherein the seven ECC bits are split into a first set including the low order six bits and a second set including the higher order bit.

13. The system of claim 9, wherein the premium directory and the common directory representation share a common format.

14. The system of claim 9, wherein the common format module formats the standard directory into the common directory representation by:

moving the low order half of the standard directory into the low order half of the common directory representation and filling the remaining bits of the low order half of the common directory representation with chosen default values;

moving the high order half of the standard directory into the high order half of the common directory representation and filling the remaining bits of the high order half of the common directory representation with chosen default values.

15. The system of claim 9, wherein the reformat module formats the error detected and corrected common directory representation into an original directory entry format by:

moving the low order half of the error detected and corrected common directory representation into the low order half of the original directory entry format, the move proceeding from right to left and terminating upon reaching the high order bit of the low order half of the original directory entry format;

moving the high order half of the error detected and corrected common directory representation into the high order half of the original directory entry format, the move proceeding from right to left and terminating upon reaching the high order bit of the high order half of the original directory entry format.

16. The system of claim 9, further comprising:

a read module operable to read a directory entry into either the standard directory or premium directory depending on a size of the directory entry.

17. The system of claim 9, further comprising:

an ECC bit generation module operable to generate ECC bits for data portions of the common directory representation.

18. The system of claim 17, further comprising:

a write module operable to write a directory entry to directory memory.

* * * * *